(12) United States Patent
Magoz

(10) Patent No.: US 12,401,352 B2
(45) Date of Patent: Aug. 26, 2025

(54) LASER DRIVER WITH PULSE SCALING CIRCUIT FOR LASER DISPLAYS

(71) Applicant: META PLATFORMS TECHNOLOGIES, LLC, Menlo Park, CA (US)

(72) Inventor: Ziv Magoz, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 954 days.

(21) Appl. No.: 17/528,099

(22) Filed: Nov. 16, 2021

(65) Prior Publication Data

US 2023/0152583 A1  May 18, 2023

(51) Int. Cl.
*H03K 5/04* (2006.01)
*H01S 5/042* (2006.01)
*G02B 27/01* (2006.01)

(52) U.S. Cl.
CPC ............. *H03K 5/04* (2013.01); *H01S 5/0428* (2013.01); *G02B 27/0101* (2013.01); *G02B 2027/0178* (2013.01)

(58) Field of Classification Search
CPC ........ G02B 27/0101; G02B 2027/0178; H01S 5/0428; H03K 5/04
USPC ........................................ 327/172, 173, 174
See application file for complete search history.

(56) References Cited

U.S. PATENT DOCUMENTS 3,719,835 A * 3/1973 Eberhard ............... H03K 3/355
  327/228
2017/0085057 A1  3/2017  Barnes et al.

FOREIGN PATENT DOCUMENTS

EP  0262713 A1  4/1988

OTHER PUBLICATIONS

International Search Report and Written Opinion for International Application No. PCT/US2022/049066, mailed Feb. 28, 2023, 13 Pages.
International Preliminary Report on Patentability for International Application No. PCT/US2022/049066, mailed May 30, 2024, 11 pages.

* cited by examiner

*Primary Examiner* — William Hernandez
(74) *Attorney, Agent, or Firm* — Greenberg Traurig, LLP

(57) ABSTRACT

A laser driver includes a pulse generator circuit, a pulse scaling circuit, and a power stage circuit. The pulse generator circuit generates a first voltage pulse of a first duration. The pulse scaling circuit includes a first transistor with a first gate electrode receiving the first voltage pulse, a capacitor having an electrode connected to a common terminal of a pair of resistors connected in series with the first transistor, and a second transistor with a second gate electrode connected to the first gate electrode and a second drain electrode coupled to a supply voltage via a resistor. Responsive to the reception of the first voltage pulse, a second voltage pulse of a second duration shorter than the first duration is generated at the second drain electrode. The power stage circuit converts the second voltage pulse into a current pulse driving at least one emission element of a laser display.

20 Claims, 12 Drawing Sheets

600

Receive an input pulse of a first duration at a first gate electrode of a first transistor
605

Charge a capacitor during the first duration, the capacitor having an electrode connected to a common terminal of a pair of resistors connected in series with the first transistor
610

Discharge the capacitor to generate an output pulse of a second duration shorter than the first duration at a second drain electrode of a second transistor, a second gate electrode of the second transistor connected to the first gate electrode and the second drain electrode coupled to a supply voltage via a resistor
615

FIG. 6

LASER DRIVER WITH PULSE SCALING CIRCUIT FOR LASER DISPLAYS

FIELD OF THE INVENTION

The present disclosure relates generally to driver circuits, and specifically relates to a laser driver with a pulse scaling circuit for laser displays.

BACKGROUND

It is still desirable nowadays to improve the efficiency and speed of pulse generators used for initiating light emissions from laser displays. This is especially critical in order to mitigate a level of a speckle pattern of light emitted from laser displays that are driven by the traditional pulse generators. One of the limiting factors of a power stage in the traditional pulse generator is a coil charging time in the power stage, which limits a frequency of pulses that can be generated by the traditional pulse generator. Another challenge is a difference between a duration of pulses that traditional pulse generators can generate (e.g., duration between 0.7 ns and 6.5 ns) and a specific pulse duration required to efficiently drive the laser displays (e.g., duration between 0.25 ns-2 ns). This specific pulse duration is required to achieve the spread spectrum effect in order to mitigate a level of speckle pattern of light emitted from the laser displays.

SUMMARY

Embodiments of the present disclosure relate to a pulse scaling circuit as a part of a laser driver driving one or more emission elements of a laser display in order to emit light in a spread spectrum for mitigating a level of coherence artifacts (e.g., a speckle pattern) of the emitted light. The pulse scaling circuit comprises: a first transistor with a first gate electrode receiving an input pulse of a first duration, a capacitor having an electrode connected to a common terminal of a pair of resistors connected in series with the first transistor, and a second transistor with a second gate electrode connected to the first gate electrode and a second drain electrode coupled to a supply voltage via a resistor. Responsive to the reception of the input pulse, an output pulse of a second duration shorter than the first duration is generated at the second drain electrode.

Embodiments of the present disclosure further relate to a method for operating a pulse scaling circuit as a part of a laser driver. The method comprises: receiving an input pulse of a first duration at a first gate electrode of a first transistor in the pulse scaling circuit, charging a capacitor in the pulse scaling circuit during the first duration, the capacitor having an electrode connected to a common terminal of a pair of resistors connected in series with the first transistor, and discharging the capacitor to generate an output pulse of a second duration shorter than the first duration at a second drain electrode of a second transistor in the pulse scaling circuit, a second gate electrode of the second transistor connected to the first gate electrode and the second drain electrode coupled to a supply voltage via a resistor.

Embodiments of the present disclosure further relate to a laser driver driving one or more emission elements of a laser display in order to emit light in a spread spectrum for mitigating a level of coherence artifacts (e.g., a speckle pattern) of the emitted light. The laser driver includes a pulse generator circuit, a pulse scaling circuit coupled to the pulse generator circuit, and a power stage circuit coupled to the pulse scaling circuit. The pulse generator circuit generates a first voltage pulse of a first duration. The pulse scaling circuit comprises: a first transistor with a first gate electrode receiving the first voltage pulse, a capacitor having an electrode connected to a common terminal of a pair of resistors connected in series with the first transistor, and a second transistor with a second gate electrode connected to the first gate electrode and a second drain electrode coupled to a supply voltage via a resistor. Responsive to the reception of the first voltage pulse, a second voltage pulse of a second duration shorter than the first duration is generated at the second drain electrode. The power stage circuit converts the second voltage pulse into a current pulse driving at least one emission element of a laser display. The laser display can be integrated into a headset. The at least one emission element driven by the current pulse emits one or more light beams in a spread spectrum mitigating a level of the coherence artifacts of light emitted from the laser display. The laser driver may be integrated into a headset for driving one or more display elements of the headset.

BRIEF DESCRIPTION OF THE DRAWINGS

FIG. 6 is a flowchart illustrating a process for operating a pulse scaling circuit in a laser driver, in accordance with one or more embodiments.

Figure 1A:
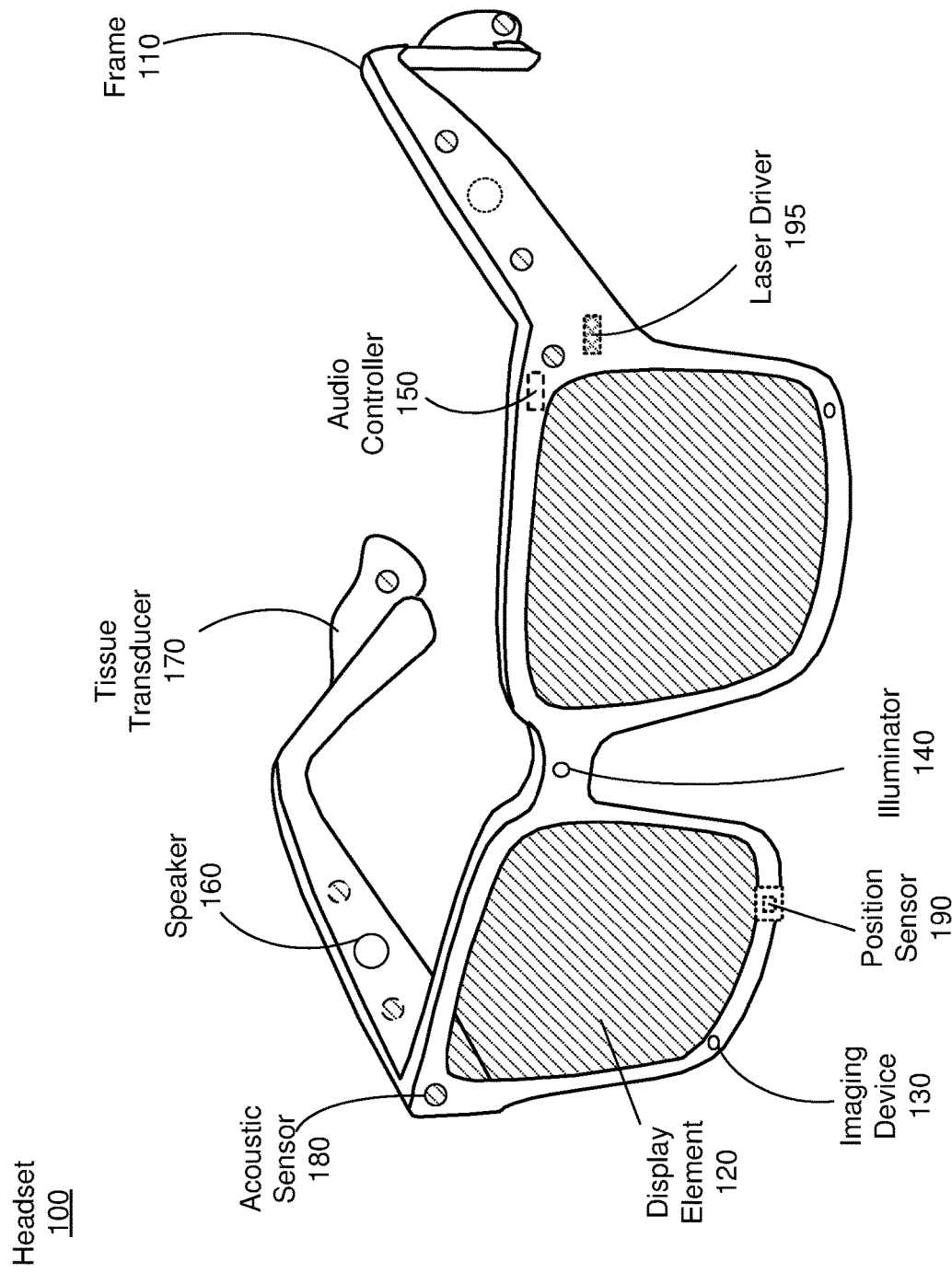
FIG. 1A is a perspective view of a headset implemented as an eyewear device, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments of the present disclosure relate to implementation of a laser driver for driving one or more emission elements of a laser display such that a spectrum of light emitted from the laser display is spread (i.e., the emitting light features the spread spectrum effect), thus mitigating a level of coherence artifacts (e.g., a speckle pattern) of the emitted light. The laser driver includes a pulse generator circuit, a pulse scaling circuit, and a power stage circuit. Responsive to input voltage pulses (e.g., 0.7 ns to 6.5 ns pulses) from the pulse generator circuit, the pulse scaling circuit may create very short output voltage pulses (e.g., 0.25 ns-2 ns pulses) to drive the power stage circuit. The power stage circuit may convert the output voltage pulses into pulses of current that drive a solid state laser (e.g., a laser diode) of the laser display. The very short output voltage pulses result in very short current pulses. Solid state lasers driven by very short current pulses emit light in a spread spectrum that reduces the coherence artifacts (e.g., speckle effect) in the emitted light. The pulse scaling circuit includes at least three transistors (e.g., high speed Gallium Nitride Field-Effect Transistors (GaN FETs)), a capacitor, and a plurality of resistors. The transistors, the capacitor, and the resistors may be configured such that charging of the capacitor takes longer than discharging of the capacitor, which results into each output voltage pulse being substantially shorter (e.g., approximately by the factor of 3) than a corresponding input voltage pulse.

The laser driver presented herein along with the laser display (i.e., one or more display elements) may be integrated into a wearable device (e.g., headset), a mobile device, or any other hardware platform capable of providing artificial reality content to a user.

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

FIG. 1A is a perspective view of a headset 100 implemented as an eyewear device, in accordance with one or more embodiments. In some embodiments, the eyewear device is a near eye display (NED). In general, the headset 100 may be worn on the face of a user such that content (e.g., media content) is presented using a display assembly and/or an audio system. However, the headset 100 may also be used such that media content is presented to a user in a different manner. Examples of media content presented by the headset 100 include one or more images, video, audio, or some combination thereof. The headset 100 includes a frame 110, and may include, among other components, a display assembly including one or more display elements 120, a depth camera assembly (DCA), an audio system, a position sensor 190, and a laser driver 195. While FIG. 1A illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1A.

The frame 110 holds the other components of the headset 100. The frame 110 includes a front part that holds the one or more display elements 120 and end pieces (e.g., temples) to attach to a head of the user. The front part of the frame 110 bridges the top of a nose of the user. The length of the end pieces may be adjustable (e.g., adjustable temple length) to fit different users. The end pieces may also include a portion that curls behind the ear of the user (e.g., temple tip, ear piece).

The one or more display elements 120 provide light to a user wearing the headset 100. As illustrated in FIG. 1A, the headset includes a display element 120 for each eye of a user. In some embodiments, a display element 120 generates image light that is provided to an eye box of the headset 100. The eye box is a location in space that an eye of the user occupies while wearing the headset 100. For example, a display element 120 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eye box of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 120 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 120 are at least partially transparent, such that light from the local area may be combined with light from the one or more display elements to produce AR and/or MR content. In accordance with embodiments of the present disclosure, each display element 120 utilizes one or more laser sources (e.g., laser diodes) for emitting image light, wherein the one or more laser sources are driven by the laser driver 195.

The laser driver 195 drives at least one of the display elements 120. The laser driver 195 may be part of the display assembly. The laser driver 195 may initially generate one or more first voltage pulses of a first duration. Using the one or more first voltage pulses, the laser driver 195 may generate one or more corresponding second voltage pulse of a second duration shorter than the first duration. The laser driver 195 may then convert the one or more second voltage pulses into one or more pulses of current for driving at least one display element 120 and initiating light emission from the at least one display element 120 in a spread spectrum, thus mitigating the coherence artifacts of the emitted light. Although FIG. 1A shows a single laser driver 195 integrated into the headset 100, the headset 100 may include a pair of laser drivers 195 each driving a respective display element 120. More details about a structure and operation of the laser driver 195 and components of the laser driver 195 are described below in conjunction with FIG. 2, FIGS. 3A-3E, and FIGS. 4-6.

In some embodiments, the display element 120 may include an additional optics block (not shown). The optics block may include one or more optical elements (e.g., lens, Fresnel lens, etc.) that direct light from the display element 120 to the eye box. The optics block may, e.g., correct for aberrations in some or all of the image content, magnify some or all of the image, or some combination thereof.

The DCA determines depth information for a portion of a local area surrounding the headset 100. The DCA includes one or more imaging devices 130 and a DCA controller (not shown in FIG. 1A), and may also include an illuminator 140. In some embodiments, the illuminator 140 illuminates a portion of the local area with light. The light may be, e.g., structured light (e.g., dot pattern, bars, etc.) in the infrared (IR), IR flash for time-of-flight, etc. In some embodiments, the one or more imaging devices 130 capture images of the portion of the local area that include the light from the illuminator 140. As illustrated, FIG. 1A shows a single illuminator 140 and two imaging devices 130. In alternate embodiments, there is no illuminator 140 and at least two imaging devices 130.

The DCA controller computes depth information for the portion of the local area using the captured images and one or more depth determination techniques. The depth determination technique may be, e.g., direct time-of-flight (ToF) depth sensing, indirect ToF depth sensing, structured light, passive stereo analysis, active stereo analysis (uses texture added to the scene by light from the illuminator 140), some other technique to determine depth of a scene, or some combination thereof.

The audio system provides audio content. The audio system includes a transducer array, a sensor array, and an audio controller 150. However, in other embodiments, the audio system may include different and/or additional components. Similarly, in some cases, functionality described with reference to the components of the audio system can be distributed among the components in a different manner than is described here. For example, some or all of the functions of the audio controller 150 may be performed by a remote server.

The transducer array presents sound to user. The transducer array includes a plurality of transducers. A transducer may be a speaker 160 or a tissue transducer 170 (e.g., a bone conduction transducer or a cartilage conduction transducer). Although the speakers 160 are shown exterior to the frame 110, the speakers 160 may be enclosed in the frame 110. The tissue transducer 170 couples to the head of the user and directly vibrates tissue (e.g., bone or cartilage) of the user to generate sound. In accordance with embodiments of the present disclosure, the transducer array comprises two transducers (e.g., two speakers 160, two tissue transducers 170, or one speaker 160 and one tissue transducer 170), i.e., one transducer for each ear. The locations of transducers may be different from what is shown in FIG. 1A.

The sensor array detects sounds within the local area of the headset 100. The sensor array includes a plurality of acoustic sensors 180. An acoustic sensor 180 captures sounds emitted from one or more sound sources in the local area (e.g., a room). Each acoustic sensor is configured to detect sound and convert the detected sound into an electronic format (analog or digital). The acoustic sensors 180 may be acoustic wave sensors, microphones, sound transducers, or similar sensors that are suitable for detecting sounds.

In some embodiments, one or more acoustic sensors 180 may be placed in an ear canal of each ear (e.g., acting as binaural microphones). In some embodiments, the acoustic sensors 180 may be placed on an exterior surface of the headset 100, placed on an interior surface of the headset 100, separate from the headset 100 (e.g., part of some other device), or some combination thereof. The number and/or locations of acoustic sensors 180 may be different from what is shown in FIG. 1A. For example, the number of acoustic detection locations may be increased to increase the amount of audio information collected and the sensitivity and/or accuracy of the information. The acoustic detection locations may be oriented such that the microphone is able to detect sounds in a wide range of directions surrounding the user wearing the headset 100.

The audio controller 150 processes information from the sensor array that describes sounds detected by the sensor array. The audio controller 150 may comprise a processor and a non-transitory computer-readable storage medium. The audio controller 150 may be configured to generate direction of arrival (DOA) estimates, generate acoustic transfer functions (e.g., array transfer functions and/or head-related transfer functions), track the location of sound sources, form beams in the direction of sound sources, classify sound sources, generate sound filters for the speakers 160, or some combination thereof.

In some embodiments, the audio system is fully integrated into the headset 100. In some other embodiments, the audio system is distributed among multiple devices, such as between a computing device (e.g., smart phone or a console) and the headset 100. The computing device may be interfaced (e.g., via a wired or wireless connection) with the headset 100. In such cases, some of the processing steps presented herein may be performed at a portion of the audio system integrated into the computing device. For example, one or more functions of the audio controller 150 may be implemented at the computing device.

The position sensor 190 generates one or more measurement signals in response to motion of the headset 100. The position sensor 190 may be located on a portion of the frame 110 of the headset 100. The position sensor 190 may include an inertial measurement unit (IMU). Examples of position sensor 190 include: one or more accelerometers, one or more gyroscopes, one or more magnetometers, another suitable type of sensor that detects motion, a type of sensor used for error correction of the IMU, or some combination thereof. The position sensor 190 may be located external to the IMU, internal to the IMU, or some combination thereof.

The audio system can use positional information describing the headset 100 (e.g., from the position sensor 190) to update virtual positions of sound sources so that the sound sources are positionally locked relative to the headset 100. In this case, when the user wearing the headset 100 turns their head, virtual positions of the virtual sources move with the head. Alternatively, virtual positions of the virtual sources are not locked relative to an orientation of the headset 100. In this case, when the user wearing the headset 100 turns their head, apparent virtual positions of the sound sources would not change.

In some embodiments, the headset 100 may provide for simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some embodiments, some or all of the imaging devices 130 of the DCA may also function as the PCA. The images captured by the PCA and the depth information determined by the DCA may be used to determine parameters of the local area, generate a model of the local area, update a model of the local area, or some combination thereof. Furthermore, the position sensor 190 tracks the position (e.g., location and pose) of the headset 100 within the room.

Figure 1B:
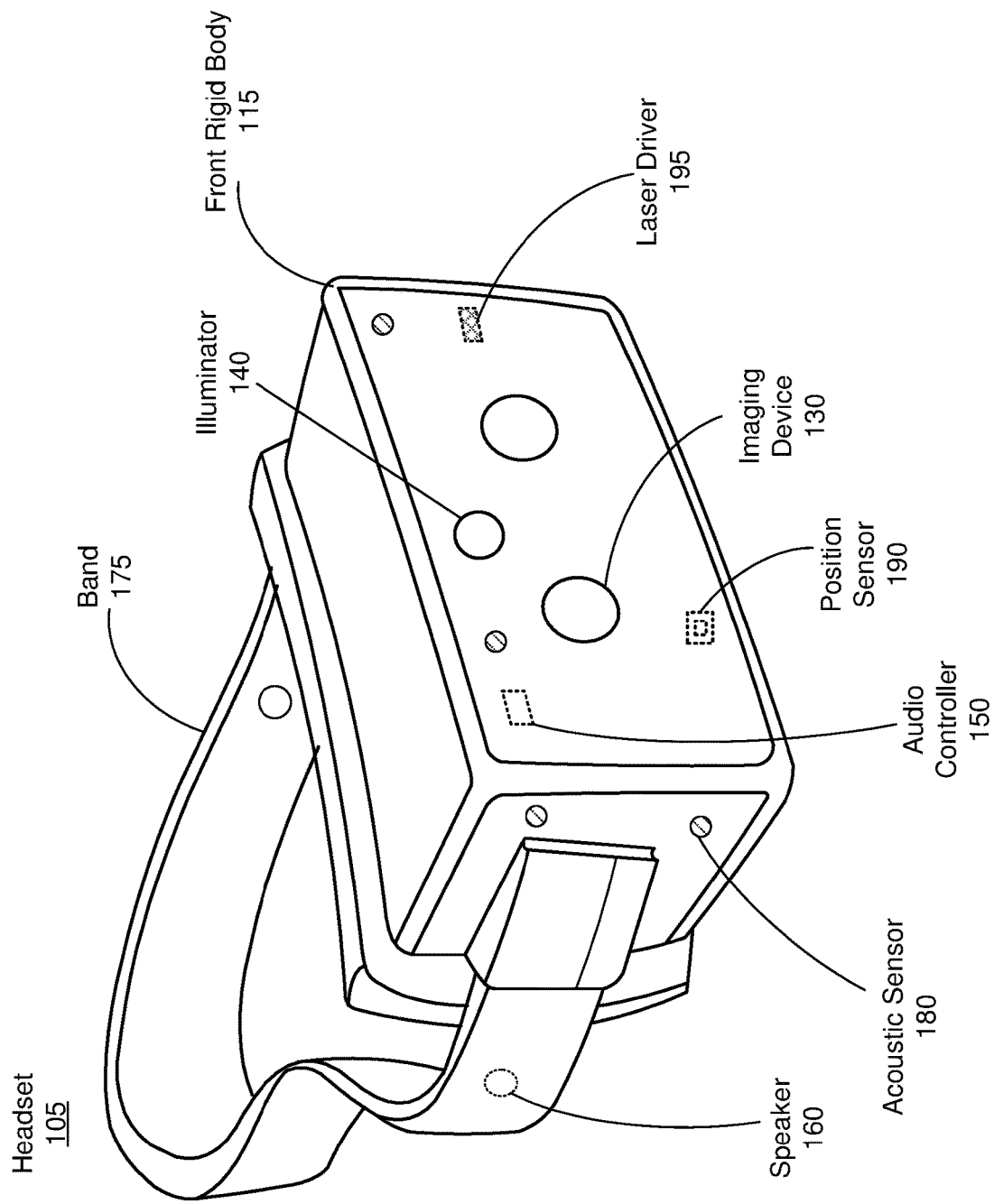
FIG. 1B is a perspective view of a headset implemented as a head-mounted display, in accordance with one or more embodiments.

FIG. 1B is a perspective view of a headset 105 implemented as a HMD, in accordance with one or more embodiments. In embodiments that describe an AR system and/or a MR system, portions of a front side of the HMD are at least partially transparent in the visible band (~380 nm to 750 nm), and portions of the HMD that are between the front side of the HMD and an eye of the user are at least partially transparent (e.g., a partially transparent electronic display). The HMD includes a front rigid body 115 and a band 175. The headset 105 includes many of the same components described above with reference to FIG. 1A, but modified to integrate with the HMD form factor. For example, the HMD includes a display assembly, a DCA, an audio system, a position sensor 190, and a laser driver 195. FIG. 1B shows the illuminator 140, a plurality of the speakers 160, a plurality of the imaging devices 130, a plurality of acoustic sensors 180, the position sensor 190, and the laser driver 195. The speakers 160 may be located in various locations, such as coupled to the band 175 (as shown), coupled to the front rigid body 115, or may be configured to be inserted within the ear canal of a user.

Figure 2:
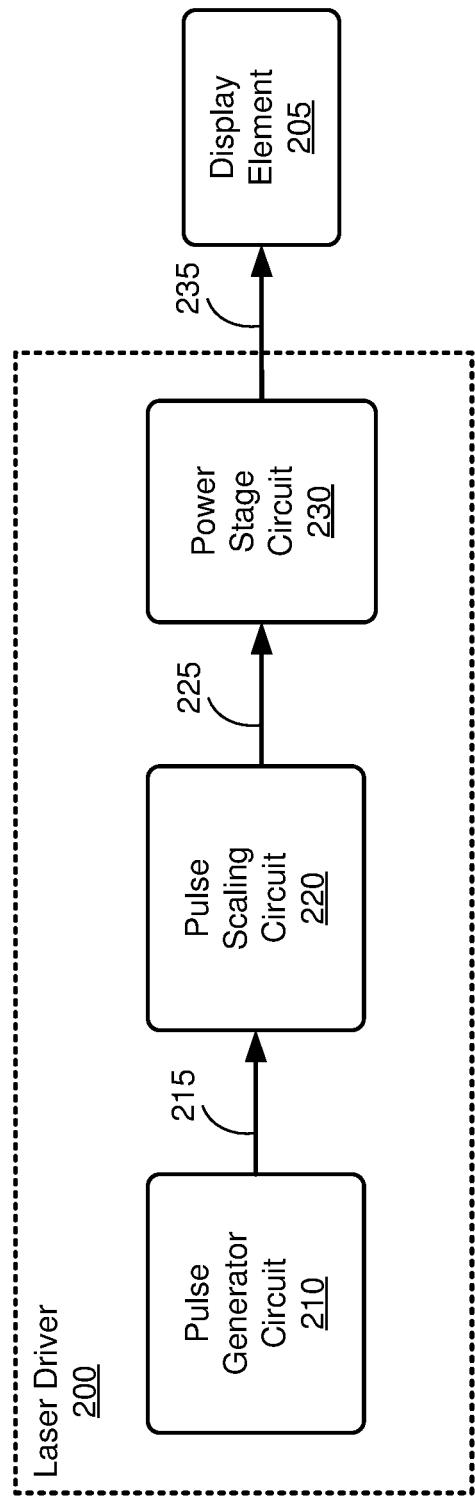
FIG. 2 is a block diagram of a laser driver coupled to a display element, in accordance with one or more embodiments.

FIG. 2 is a block diagram of a laser driver 200 coupled to a display element 205, in accordance with one or more embodiments. The laser driver 195 may be an embodiment of the laser driver 200, and the display element 205 may be an embodiment of the display element 120. The laser driver 200 includes a pulse generator circuit 210, a pulse scaling circuit 220 coupled to the pulse generator circuit 210, and a power stage circuit 230 coupled to the pulse scaling circuit 220.

The pulse generator circuit 210 is an electrical circuit that generates a voltage signal 215. The voltage signal 215 may comprise one or more input voltage pulses of a first duration, e.g., between approximately 0.7 ns and 6.5 ns. The pulse generator circuit 210 may be implemented using a Field Programmable Gate Array (FPGA) technology, Application Specific Integrated Circuit (ASIC) technology, some other technology, or combination thereof.

The pulse scaling circuit 220 is an electrical circuit that converts the one or more input voltage pulses of the voltage signal 215 having the first duration into a voltage signal 225 having one or more output voltage pulses of a second duration shorter than the first duration (e.g., by the factor of 3). The second duration of the one or more output voltage pulses may be between, e.g., 0.25 ns and 2 ns. Thus, the pulse scaling circuit 220 may be configured to scale a duration of each input voltage pulse in the voltage signal 215 when generating a respective output voltage pulses in the voltage signal 225. The pulse scaling circuit 220 may scale a duration of the input voltage pulses by utilizing an asymmetric charge and discharge cycles of a capacitor in the pulse scaling circuit 220. The capacitor in the pulse scaling circuit 220 may be charged at a lower electrical current that it is being discharged at, which results in a longer charge time then a discharge time. A ratio of the charge time to the discharge time may directly relate to a ratio of a charge current (e.g., provided by a charge current source) to a discharge current (e.g., provided by a discharge current sink) in the pulse scaling circuit 220. For example, the charge current may be approximately 3.25 times smaller than the discharge current, which results into a duration of each output voltage pulses in the voltage signal 225 being approximately 3.25 times shorter than a duration of a corresponding input voltage pulses in the voltage signal 215. More details about a structure and operation of the pulse scaling circuit 220 are provided below in conjunction with FIGS. 3A-3E and FIG. 6.

The power stage circuit 230 is an electrical circuit the converts one or more output voltage pulses in the voltage signal 225 into one or more pulses of current in a signal 235. The signal 235 comprising the one or more pulses of current generated by the power stage circuit 230 may be suitable for driving at least one emission element of the display element 205. The at least one emission element of the display element 205 driven by the signal 235 including the one or more pulses of current may emit one or more light beams in a spread spectrum thus mitigating a level of coherence artifacts (e.g., a speckle pattern) of light emitted from the display element 205. The spread spectrum may depend on a length and/or color of each current pulse in the signal 235, where shorter current pulses in the signal 235 may provide more spread in the spectrum of emitted light. For example, the length of 2 ns of the current pulse in the signal 235 may provide substantial improvement in relation with coherence artifacts in the emitted light. Another advantage of the short current pulses is an emission efficiency since the at least one emission element of the display element 205 may produce more light with short and high-amplitude current pulses in comparison with long and low-amplitude current pulses. The at least one emission element of the display element 205 may be implemented as a laser diode. More details about a structure and operation of the power stage circuit 230 are provided below in conjunction with FIG. 4.

Figure 3A:
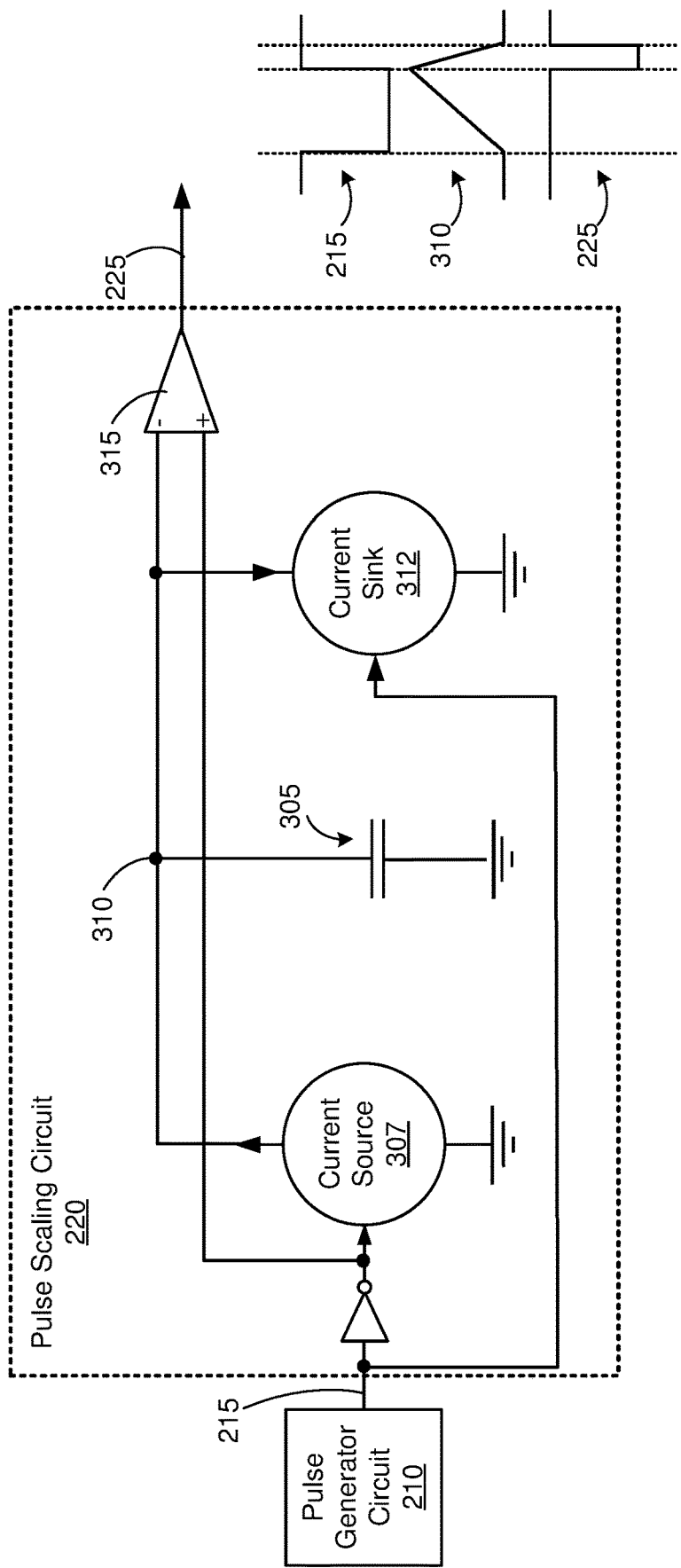
FIG. 3A is a block diagram of a pulse scaling circuit coupled to a pulse generator circuit of the laser driver in FIG. 2.

FIG. 3A is a block diagram of the pulse scaling circuit 220 coupled to the pulse generator circuit 210, in accordance with one or more embodiments. As discussed above, the pulse generator circuit 210 may generate the voltage signal 215 having one or more input voltage pulses of a first duration, e.g., between 0.7 ns and 6.5 ns. The pulse scaling circuit 220 may generate the voltage signal 225 with one or more output voltage pulses where a second duration of each output voltage pulse is scaled down relative to the first duration of a corresponding input voltage pulse in the voltage signal 215, e.g., by approximately the factor of 3. The pulse scaling circuit 220 may include a capacitor 305, a current source 307, a current sink 312, and an operational amplifier 315 that outputs the voltage signal 225.

The pulse scaling circuit 220 may scale down a duration of each input pulse in the voltage signal 215 to generate a corresponding output pulse in the voltage signal 225 by utilizing asymmetric charge and discharge cycles of the capacitor 305. The capacitor 305 may be charged by a first current of the current source 307 that causes an increase of a voltage signal at a terminal 310 at a charge rate. The capacitor 305 may be discharged by a second current of the current sink 312 that causes a decrease of the voltage signal at the terminal 310 at a discharge rate faster than the charge rate. As the current sink 312 may be configured such that the second current of the current sink 312 is larger than the first current of the current source 307 (e.g., by approximately 3.25 times), a charge time of the capacitor 305 is longer than a discharge time of the capacitor 305 (e.g., by the same ratio of approximately 3.25 times). A ratio of the charge time to the discharge time (e.g., ratio of 3.25) may correspond to a ratio of an average value of the second current of the current sink 312 to an average value of the first current of the current source 307, which may further correspond to a ratio of the first duration of an input voltage pulse in the voltage signal 225 to the second duration of an output voltage pulse in the voltage signal 225. Thus, the second duration of the output voltage pulse in the voltage signal 225 generated by the pulse scaling circuit 220 is shorter by, e.g., 3.25 times compared to the first duration of the input voltage pulse in the voltage signal 215 generated by the pulse generator circuit 210 and provided as an input into the pulse scaling circuit 220.

Figure 3B:
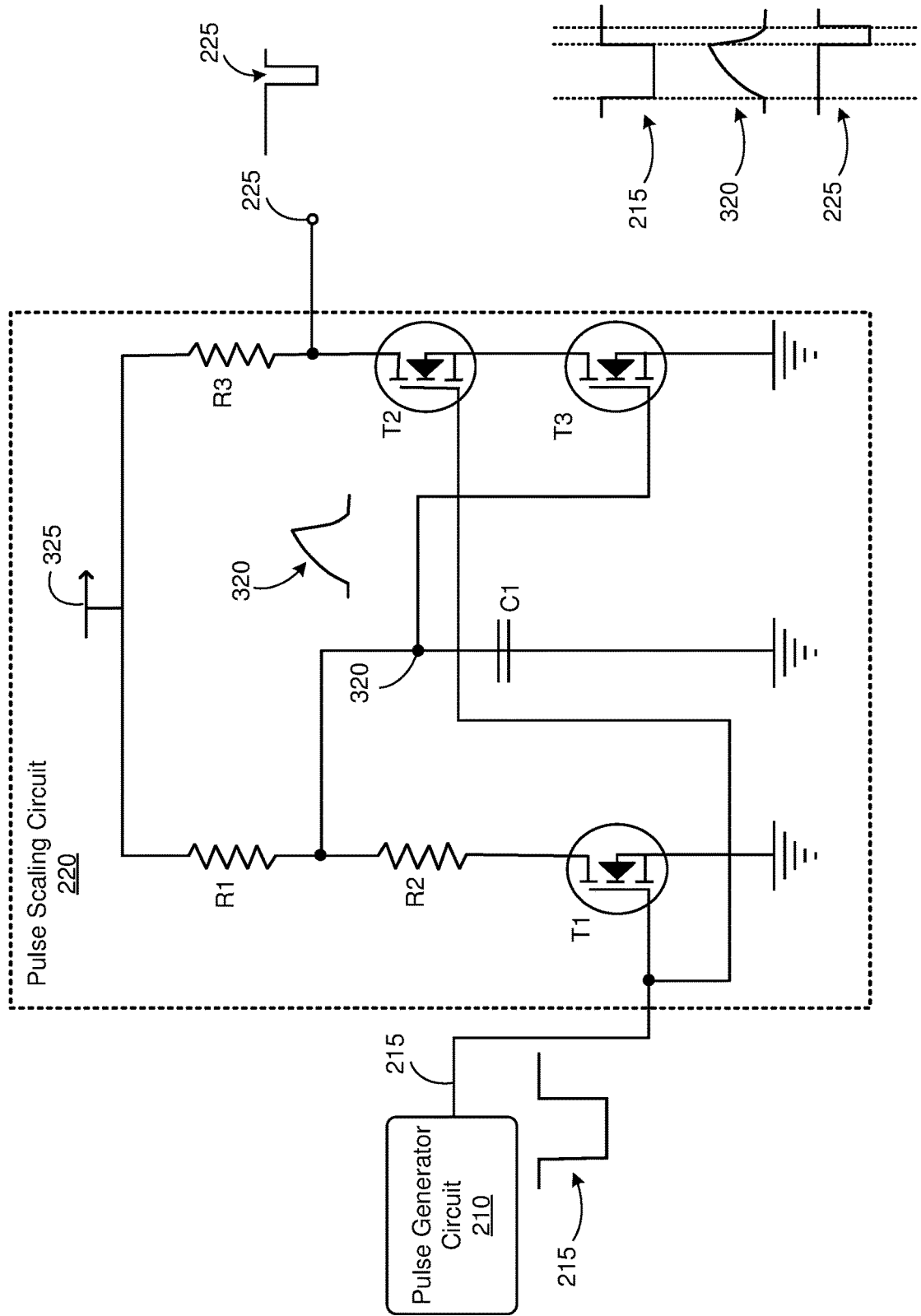
FIG. 3B is an example schematic of the pulse scaling circuit coupled to the pulse generator circuit, in accordance with one or more embodiments.

FIG. 3B illustrates an example schematic of the pulse scaling circuit 220 coupled to the pulse generator circuit 210, in accordance with one or more embodiments. The schematic of pulse scaling circuit 220 shown in FIG. 3B represents an example implementation of the block diagram of the pulse scaling circuit 220 in FIG. 3A. The pulse scaling circuit 220 may be able to operate at high speeds in order to support operations on nanoseconds pulses. Because of that, the current source 307, the current sink 312, and the operational amplifier 315 of the block diagram in FIG. 3A are not practical and are replaced in the example schematic in FIG. 3B by high speed GaN FETs and resistors.

The example schematic of the pulse scaling circuit 220 in FIG. 3B includes a first transistor T1 connected in series with a pair of resistors R1 and R2 (i.e., configured as a voltage divider) further connected to a supply voltage 325 (e.g., a positive supply voltage), which represents a practical design of the current source 307 for charging a capacitor C1. The capacitor C1 may be an embodiment of the capacitor 305 in FIG. 3A. The example schematic of the pulse scaling circuit 220 in FIG. 3B further includes a pair of transistors T2, T3 connected in series with a resistor R3 further connected to the supply voltage 325, which represents a practical design of the current sick 312 for discharging the capacitor C1. The transistors T1, T2, T3 can function as on/off switches and can be implemented as, e.g., high speed GaN FETs.

A gate electrode of the first transistor T1 may receive an input voltage pulse of the voltage signal 215 of the first duration. An electrode of the capacitor C1 may be connected to a common terminal 320 of the resistors R1, R2. A gate electrode of the second transistor T2 may be connected to the gate electrode of the first transistor T1, and a drain electrode of the second transistor T2 may be coupled to the supply voltage 325 via the resistor R3. The drain electrode of the second transistor T2 may provide the voltage signal 225 for, e.g., the power stage circuit 230. The common terminal 320 may be further connected to a gate electrode of the third transistor T3.

FIG. 3B further shows relative timing graphs of an input voltage pulse in the voltage signal 215, a voltage at the common terminal 320, and a corresponding output voltage pulse in the voltage signal 225. It can be observed that the input voltage pulse in the voltage signal 215 coincides with the charge cycle of the capacitor C1, and that the output voltage pulse in the voltage signal 225 coincides with the discharge cycle of the capacitor C1 that follows the charge cycle. More details about the charge cycle and the discharge cycle are provided below in conjunction with FIG. 3C and FIG. 3D, respectively.

Figure 3C:
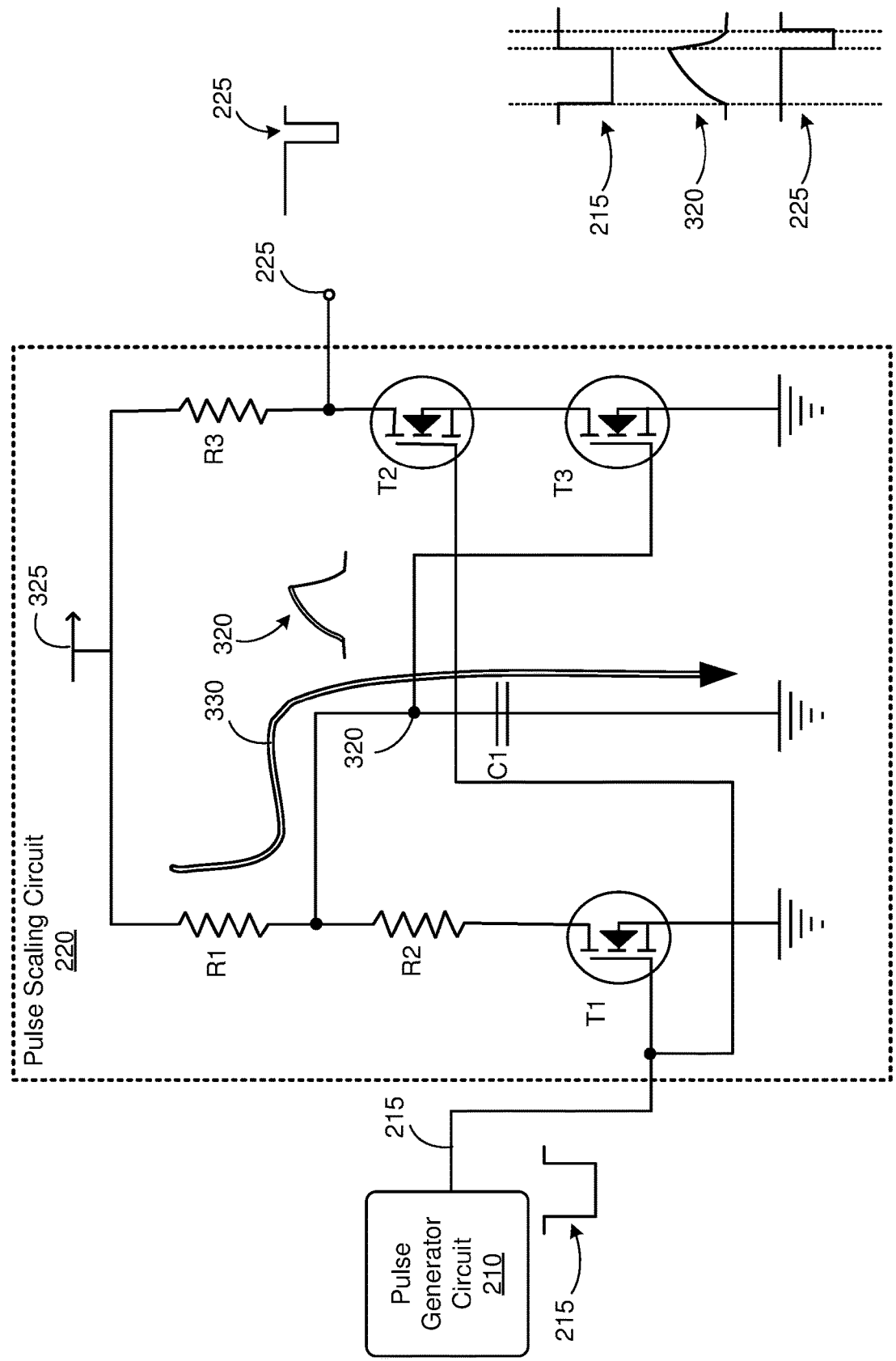
FIG. 3C illustrates a charge cycle of the pulse scaling circuit in FIG. 3B.

FIG. 3C illustrates the charge cycle of the pulse scaling circuit 220, in accordance with one or more embodiments. The input voltage pulse in the voltage signal 215 may cause the first transistor T1 and the second transistor T2 to be turned off during the charge cycle. The capacitor C1 may be charged during the charge cycle with a charge current 330 flowing from the supply voltage 325, through the resistor R1 and to the capacitor C1, as shown in FIG. 3C. The flow of charge current 330 charges the capacitor C1 and increases a level of the voltage signal at the common terminal 320. During the charge cycle, the second transistor T2 is kept open (i.e., turned off) by a low level of the input voltage pulse in the voltage signal 215 provided to the gate electrode of the second transistor T2 in order to prevent the pulse scaling circuit 220 from outputting voltage signals during the charge cycle.

Figure 3D:
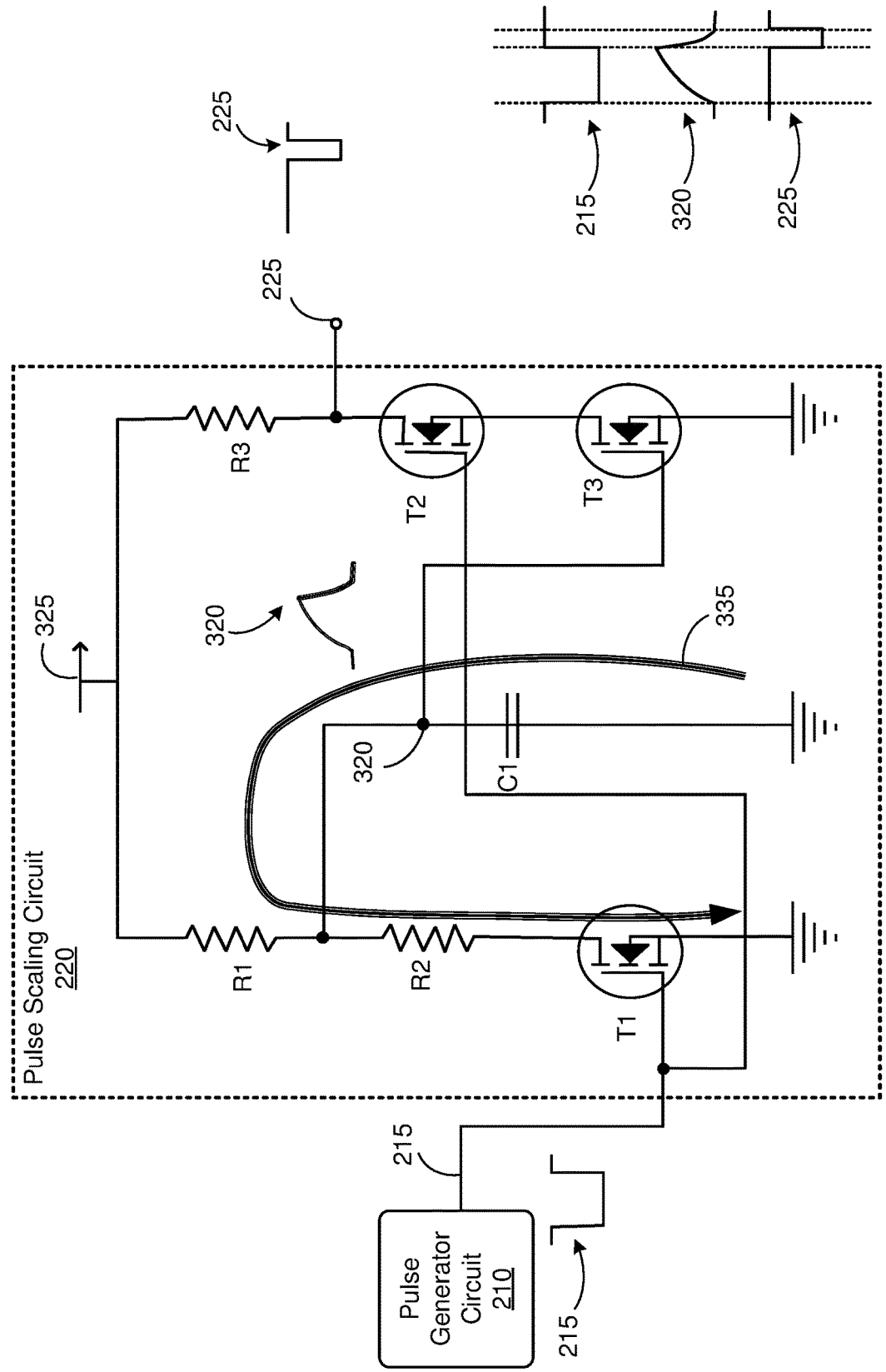
FIG. 3D illustrates a discharge cycle of the pulse scaling circuit in FIG. 3B.

FIG. 3D illustrates the discharge cycle of the pulse scaling circuit 220, in accordance with one or more embodiments. Note that the discharge cycle immediately follows the charge cycle. The end of the input voltage pulse in the voltage signal 215 causes also the end of the charge cycle of the capacitor C1 and represents a beginning of the discharge cycle of the capacitor C1. At the end of the input voltage pulse in the voltage signal 215, the first transistor T1 and the second transistor T2 may be turned on due to a high level of the voltage signal 215 (i.e., lack of the input voltage pulse). At the same time, the third transistor T3 may be also turned on due to the voltage signal at the common terminal 320 being higher than a threshold voltage of the gate electrode of the third transistor T3 (i.e., the capacitor C1 has been charged). The capacitor C1 may be discharged during the discharge cycle with a discharge current 335 flowing through the resistor R2 and the first transistor T1, as shown in FIG. 3D. The flow of discharge current 335 discharges the capacitor C1 and decreases a level of the voltage signal at the common terminal 320.

Note that a ratio between the resistance R1 and the resistance R2 may satisfy the following two conditions. First, a level of voltage signal at the common terminal 320 (i.e., the capacitor voltage) at a full discharge state of the capacitor C1 may be below a threshold voltage of the gate electrode of the transistor T3. Thus, the ratio between the resistance R1 and the resistance R2 may be such that the level of the voltage signal at the common terminal 320 at the end of the discharge cycle is below the threshold voltage of the gate electrode of the third transistor T3. Thus, the output pulse of the voltage signal 225 may last until the level of voltage signal at the common terminal 320 becomes lower than the threshold voltage of the gate electrode of the third transistor T3. Second, the ratio between the average value of the charge current 330 and the average value of the discharge current 335 reflects a desired ratio between the first duration of the input voltage pulse in the voltage signal 215 and the second duration of the output voltage pulse in the voltage signal 225. Note that the average value of the charge current 330 in FIG. 3C is proportional to the resistance R1, and the average value of the discharge current 335 in FIG. 3D is proportional to the resistance R2. Thus, a ratio between the resistance R1 and the resistance R2 may correspond to a ratio between the average value of the charge current 330 and the average value of the discharge current 335, which further corresponds to a ratio between the first duration of the input pulse in the voltage signal 215 and the second duration of the output pulse in the voltage signal 225.

Figure 3E:
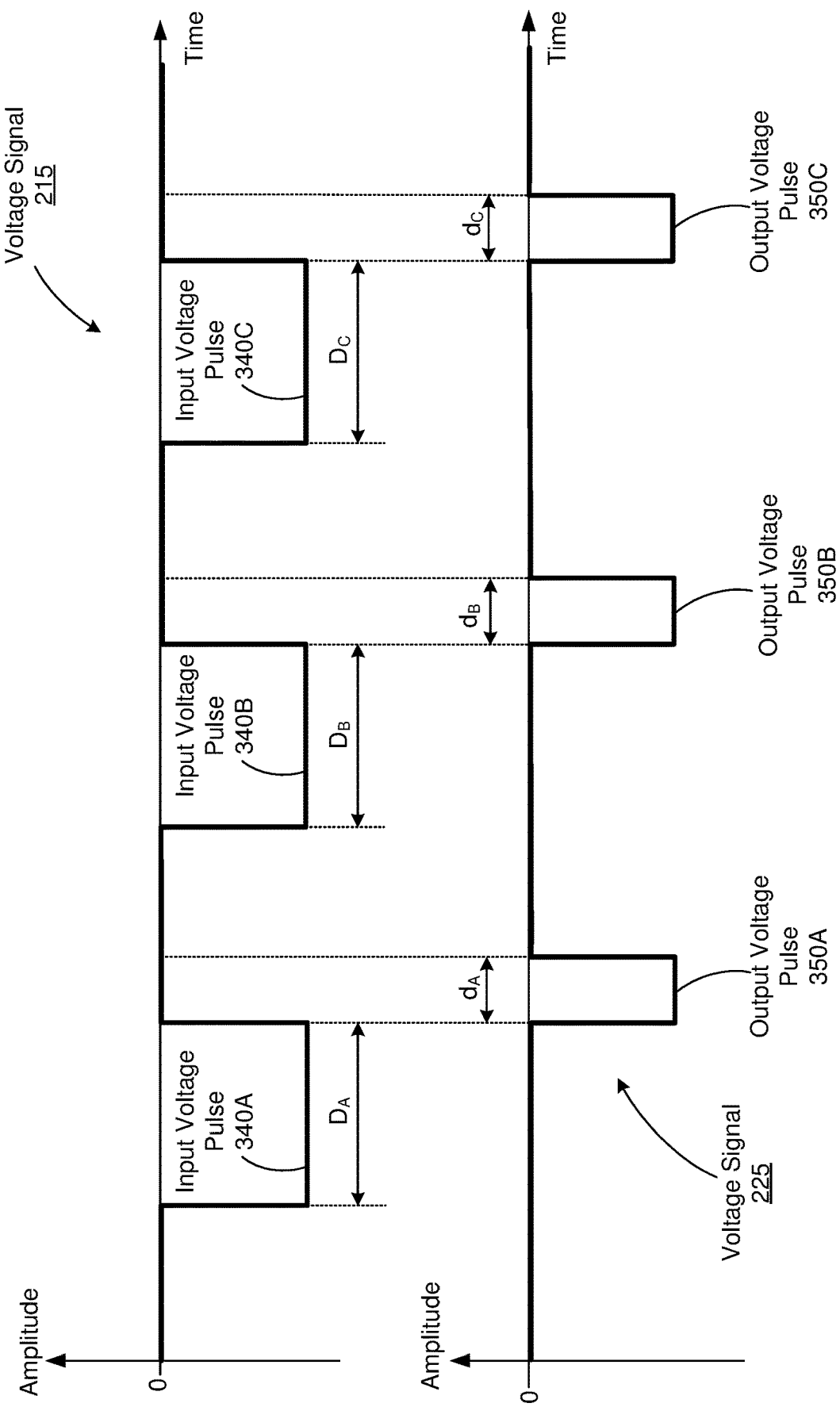
FIG. 3E illustrates example input voltage pulses provided into the pulse scaling circuit in FIG. 3B and output voltage pulses generated by the pulse scaling circuit in FIG. 3B.

FIG. 3E illustrates example input voltage pulses 340A, 340B, 340C in the voltage signal 215 provided into the pulse scaling circuit 220 and corresponding output voltage pulses 350A, 350B, 350C in the voltage signal 225 generated by the pulse scaling circuit 220, in accordance with one or more embodiments. FIG. 3E illustrates example sequences of three input voltage pulses in the voltage signal 215 and three output voltage pulses in the voltage signal 225. However, other sequences of more than three input voltage pulses in the voltage signal 215 and more than three output voltage pulses in the voltage signal 225 are possible, as well as sequences of less than three input voltage pulses in the voltage signal 215 and less than three output voltage pulses in the voltage signal 225.

Responsive to the reception of the input pulse 340A of a duration $D_A$ (e.g., between 0.7 ns and 6.5 ns) at the gate electrode of the first transistor T1 in FIG. 3B, the corresponding output voltage pulse 350A of a duration $d_A$ (e.g., between 0.25 ns and 2 ns) shorter than the duration $D_A$ may be generated at the second drain electrode of the transistor T2. Similarly, responsive to the reception of the input voltage pulse 340B of a duration $D_B$ (e.g., between 0.7 ns and 6.5 ns) at the gate electrode of the first transistor T1, the corresponding output voltage pulse 350B of a duration $d_B$ (e.g., between 0.25 ns and 2 ns) shorter than the duration $D_B$ may be generated at the second drain electrode of the transistor T2. Similarly, responsive to the reception of the input voltage pulse 340C of a duration $D_C$ (e.g., between 0.7 ns and 6.5 ns) at the gate electrode of the first transistor T1, the corresponding output voltage pulse 350C of a duration de (e.g., between 0.25 ns and 2 ns) shorter than the duration $D_C$ is generated at the second drain electrode of the transistor T2. In one or more embodiments, the durations of the input voltage pulses in the voltage signal 215, $D_A$, $D_B$, $D_C$, may be the same, which causes that the durations of the output voltage pulses in the voltage signal 225, $d_A$, $d_B$, $d_C$ are also the same. In one or more other embodiments, each input voltage pulse 340A, 340B, 340C in the voltage signal 215 may have a unique duration, which causes that a corresponding output voltage pulse 350A, 350B, 350C in the voltage signal 225 also has a unique duration. In general, each output voltage pulse 350A, 350B, 350C may be compressed (scaled down) in time relative to a respective input voltage pulse 340A, 340B, 340C by a factor T (e.g., 3<τ<3.5). Furthermore, an amplitude of each output voltage pulse 350A, 350B, 350C may be adjusted (increased or decreased) relative to an amplitude of a respective input voltage pulse 340A, 340B, 340C, e.g., by a factor α.

Figure 4:
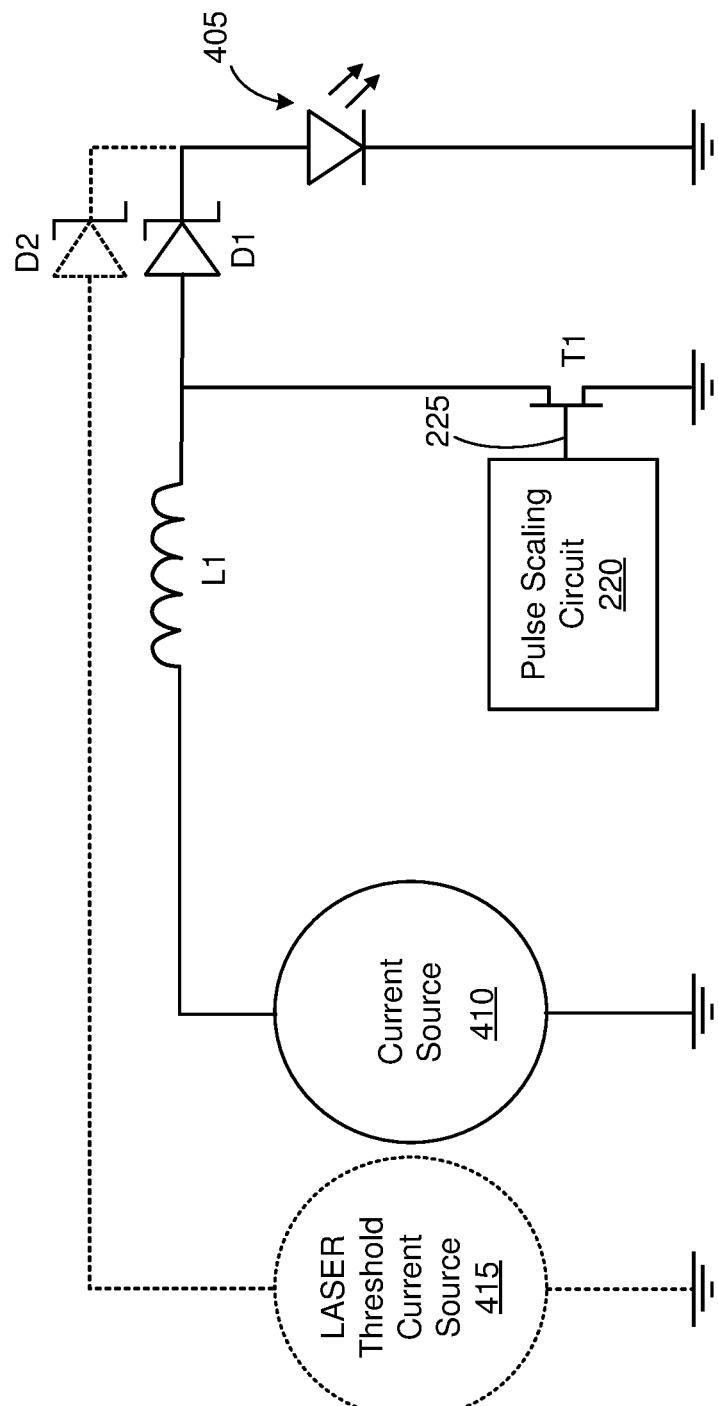
FIG. 4 is a block diagram of a power stage circuit of the laser driver in FIG. 2.

FIG. 4 is a block diagram of the power stage circuit 230, in accordance with one or more embodiments. The power stage circuit 230 may receive one or more voltage pulses of the voltage signal 225 generated by the pulse scaling circuit 220 and generate one or more corresponding current pulse for driving a laser diode (i.e., light emitting diode) 405. The power stage circuit 230 may be supplied by a current source 410, and the voltage signal 225 generated by the pulse scaling circuit 220 may be input into a gate electrode of a transistor T1 (e.g., GaN FET) that operates as a pulse-width modulation (PWM) controlled current source. The PWM controlled current source (i.e., the transistor T1), an inductor L1 and a first Schottky diode D1 supplied by the current source 410 may operate in accordance with levels of the voltage signal 225 such that each voltage pulse in the voltage signal 225 can be converted into a corresponding pulse flowing through the laser diode 405 thus initiating light emission in a spread spectrum. In one or more embodiments, the power stage circuit 230 further includes a LASER (Light Amplification by Stimulated Emission of Radiation) threshold current source 415 coupled to the laser diode 405 via a second Schottky diode D2 for providing a faster response time of the laser diode 405. The LASER threshold current source 415 may be implemented as a fixed current source (e.g., a resistor). The LASER threshold current source 415 may provide a current that has an average level of amplitude below an emission point of the laser diode 405, thereby improving the response time of the laser diode 405.

Figure 5:
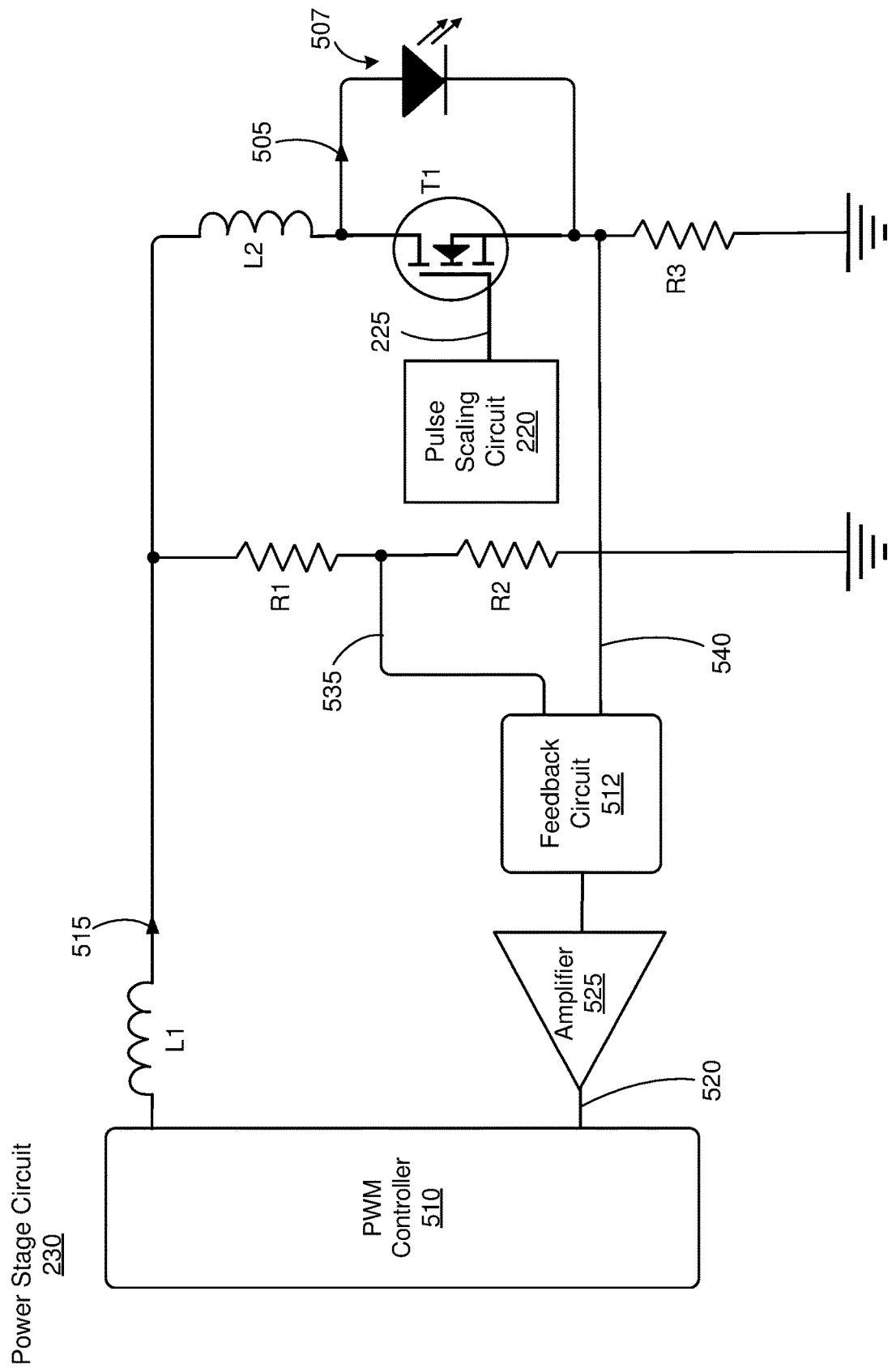
FIG. 5 is an example schematic of the power stage circuit in FIG. 4.

FIG. 5 illustrates an example schematic of the power stage circuit 230, in accordance with one or more embodiments.

The example schematic in FIG. 5 represents an example practical design of the block diagram of the power stage circuit 230 in FIG. 4. The power stage circuit 230 may receive voltage pulses of the voltage signal 225 generated by the pulse scaling circuit 220 at a gate electrode of a transistor T1 (e.g., GaN FET). The power stage circuit 230 may convert each voltage pulse of the voltage signal 225 into a corresponding current pulses of a current 505 for driving a laser diode (e.g., light emitting diode) 507 to emit light in a spread spectrum.

It can be observed from FIG. 4 and FIG. 5 that the current source 410 in the block diagram of FIG. 4 is based on a current mode PWM controller 510 with dual feedback loops. Outputs of both feedback loops are provided to the PWM controller 510 via a feedback circuit 512, which facilitates regulation of a current 515 generated by the PWM controller 510. The feedback circuit 512 provides a corresponding feedback signal 520 to the PWM controller 505 via, e.g., an amplifier 525.

The first feedback loop in the power stage circuit 230 may be a voltage feedback loop for achieving a desired level of safety of the laser diode 507. The first feedback loop may include a first portion of the schematic including an inductor L1 and a series of resistors R1, R2 (i.e., voltage divider) coupled to a first input 535 of the feedback circuit 512. The first portion of the schematic including the inductor L1 and the resistors R1, R2 may generate a voltage signal at the first input 535 of the feedback circuit 512. The second feedback loop may be a current feedback loop for achieving a proper operation of the laser diode 507. The second feedback loop may include a second portion of the schematic including an inductor L2 in a series with the transistor T1 and resistor R3, which is coupled to a second input 540 of the feedback circuit 512. The second portion of the schematic including the inductor L2 in series with the transistor T1 and the resistor R3 may generate a voltage signal at the second input 540 proportional to a current flowing through the resistor R3. The feedback signal 520 for the PWM controller 510 may be generated based on the voltage signal at the first input 535 of the feedback circuit 512 and the current signal at the second input 540 of the feedback circuit 512. The PWM controller 510 may regulate the current 515 in accordance with the feedback signal 520 for proper operation of the laser diode 507.

FIG. 6 is a flowchart illustrating a process 600 for operating a pulse scaling circuit (e.g., the pulse scaling circuit 220) in a laser driver (e.g., the laser driver 200), in accordance with one or more embodiments. The process 600 shown in FIG. 6 may be performed by components of the pulse scaling circuit (e.g., components of the pulse scaling circuit 220). Other entities may perform some or all of the steps in FIG. 6 in other embodiments. Embodiments may include different and/or additional steps, or perform the steps in different orders.

The pulse scaling circuit receives 605 an input pulse of a first duration at a first gate electrode of a first transistor. The first duration may be in the order of nanoseconds. For example, the first duration may be between 0.7 ns and 6.5 ns. The first transistor may be a GaN FET.

The pulse scaling circuit charges 610 a capacitor during the first duration, the capacitor having an electrode connected to a common terminal of a pair of resistors connected in series with the first transistor. The input pulse may coincide with a charge cycle of the capacitor. The capacitor may be charged during a charge cycle with a charge current flowing through a first resistor in the pair. The input pulse may cause the first transistor to be turned off during the charge cycle.

The pulse scaling circuit discharges 615 the capacitor to generate an output pulse of a second duration shorter than the first duration at a second drain electrode of a second transistor, a second gate electrode of the second transistor connected to the first gate electrode and the second drain electrode coupled to a supply voltage via a resistor. The second duration may be in the order of nanoseconds or below 1 nanosecond. For example, the second duration may be between 0.25 ns and 2 ns. The output pulse may coincide with a discharge cycle of the capacitor following the charge cycle. The capacitor may be discharged during a discharge cycle following the charge cycle with a discharge current flowing through a second resistor in the pair and the first transistor. A ratio between a first resistance of the first resistor and a second resistance of the second resistor may cause that a ratio between an average value of the charge current and an average value of the discharge current corresponds to a ratio between the first duration and the second duration. The second transistor may be a GaN FET transistor.

System Environment

Figure 7:
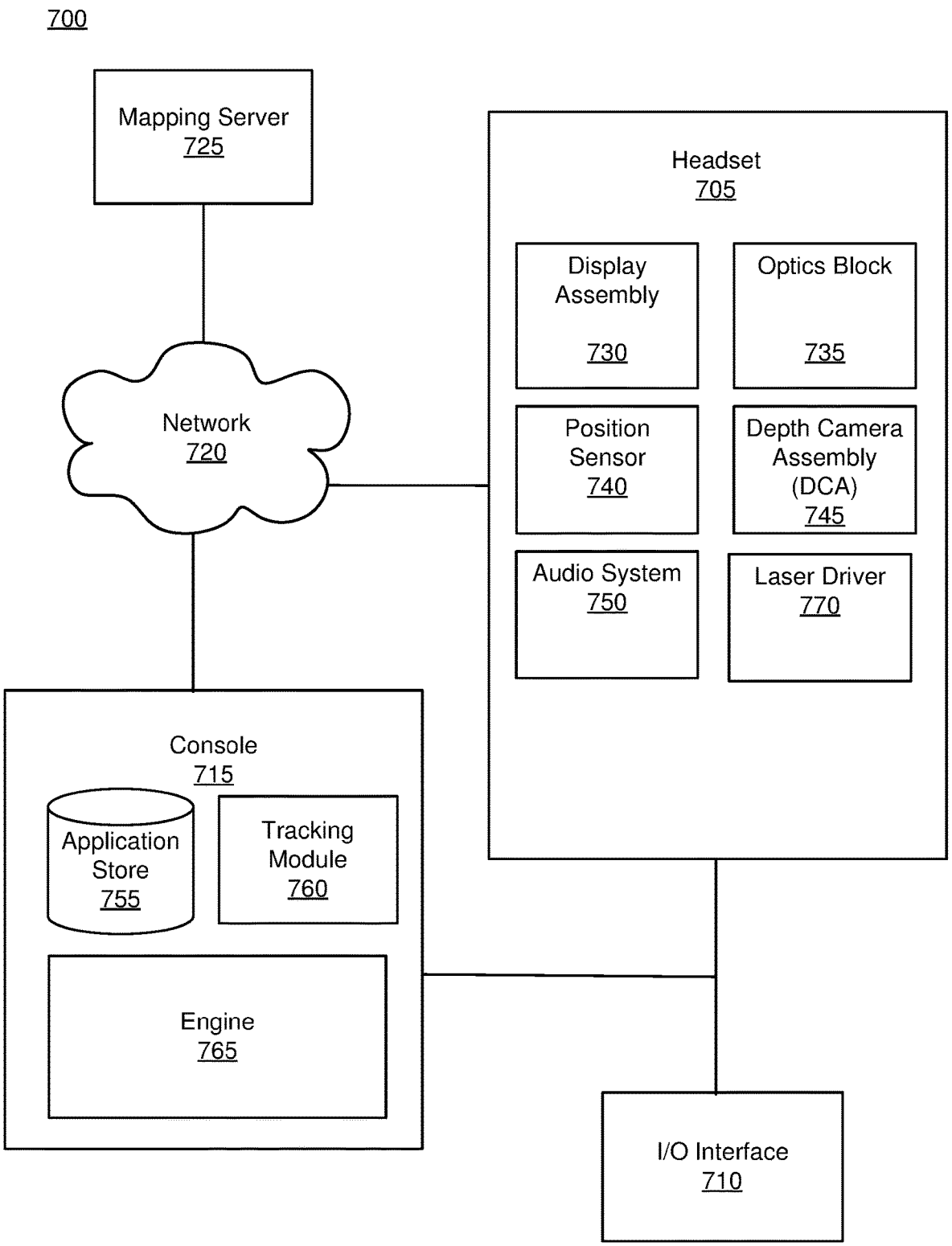
FIG. 7 depicts a block diagram of a system that includes a headset, in accordance with one or more embodiments.

FIG. 7 is a system 700 that includes a headset 705, in accordance with one or more embodiments. In some embodiments, the headset 705 may be the headset 100 of FIG. 1A or the headset 105 of FIG. 1B. The system 700 may operate in an artificial reality environment (e.g., a virtual reality environment, an augmented reality environment, a mixed reality environment, or some combination thereof). The system 700 shown by FIG. 7 includes the headset 705, an input/output (I/O) interface 710 that is coupled to a console 715, the network 720, and the mapping server 725. While FIG. 7 shows an example system 700 including one headset 705 and one I/O interface 710, in other embodiments any number of these components may be included in the system 700. For example, there may be multiple headsets each having an associated I/O interface 710, with each headset and I/O interface 710 communicating with the console 715. In alternative configurations, different and/or additional components may be included in the system 700. Additionally, functionality described in conjunction with one or more of the components shown in FIG. 7 may be distributed among the components in a different manner than described in conjunction with FIG. 7 in some embodiments. For example, some or all of the functionality of the console 715 may be provided by the headset 705.

The headset 705 includes the display assembly 730, an optics block 735, one or more position sensors 740, a DCA 745, an audio system 750, and a laser driver 770. Some embodiments of headset 705 have different components than those described in conjunction with FIG. 7. Additionally, the functionality provided by various components described in conjunction with FIG. 7 may be differently distributed among the components of the headset 705 in other embodiments, or be captured in separate assemblies remote from the headset 705.

The display assembly 730 displays content to the user in accordance with data received from the console 715. The display assembly 730 displays the content using one or more display elements (e.g., the display elements 120). A display element may be, e.g., an electronic display. In various embodiments, the display assembly 730 comprises a single display element or multiple display elements (e.g., a display for each eye of a user). Note in some embodiments, the display element 120 may also include some or all of the functionality of the optics block 735. In accordance with embodiments of the present disclosure, the display assembly 730 utilizes one or more laser sources (e.g., laser diodes) for emitting image light with the content, and the one or more laser sources are driven by the laser driver 770.

The optics block 735 may magnify image light received from the electronic display, corrects optical errors associated with the image light, and presents the corrected image light to one or both eye boxes of the headset 705. In various embodiments, the optics block 735 includes one or more optical elements. Example optical elements included in the optics block 735 include: an aperture, a Fresnel lens, a convex lens, a concave lens, a filter, a reflecting surface, or any other suitable optical element that affects image light. Moreover, the optics block 735 may include combinations of different optical elements. In some embodiments, one or more of the optical elements in the optics block 735 may have one or more coatings, such as partially reflective or anti-reflective coatings.

Magnification and focusing of the image light by the optics block 735 allows the electronic display to be physically smaller, weigh less, and consume less power than larger displays. Additionally, magnification may increase the field of view of the content presented by the electronic display. For example, the field of view of the displayed content is such that the displayed content is presented using almost all (e.g., approximately 110° diagonal), and in some cases, all of the user's field of view. Additionally, in some embodiments, the amount of magnification may be adjusted by adding or removing optical elements.

In some embodiments, the optics block 735 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 735 corrects the distortion when it receives image light from the electronic display generated based on the content.

The position sensor 740 is an electronic device that generates data indicating a position of the headset 705. The position sensor 740 generates one or more measurement signals in response to motion of the headset 705. The position sensor 190 is an embodiment of the position sensor 740. Examples of a position sensor 740 include: one or more IMUs, one or more accelerometers, one or more gyroscopes, one or more magnetometers, another suitable type of sensor that detects motion, or some combination thereof. The position sensor 740 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 705 from the sampled data. For example, the IMU integrates the measurement signals received from the accelerometers over time to estimate a velocity vector and integrates the velocity vector over time to determine an estimated position of a reference point on the headset 705. The reference point is a point that may be used to describe the position of the headset 705. While the reference point may generally be defined as a point in space, however, in practice the reference point is defined as a point within the headset 705.

The DCA 745 generates depth information for a portion of the local area. The DCA includes one or more imaging devices and a DCA controller. The DCA 745 may also include an illuminator. Operation and structure of the DCA 745 is described above in conjunction with FIG. 1A.

The audio system 750 provides audio content to a user of the headset 705. The audio system 750 is substantially the same as the audio system 200 described above. The audio system 750 may comprise one or acoustic sensors, one or more transducers, and an audio controller. The audio system 750 may provide spatialized audio content to the user. In some embodiments, the audio system 750 may request acoustic parameters from the mapping server 725 over the network 720. The acoustic parameters describe one or more acoustic properties (e.g., room impulse response, a reverberation time, a reverberation level, etc.) of the local area. The audio system 750 may provide information describing at least a portion of the local area from e.g., the DCA 745 and/or location information for the headset 705 from the position sensor 740. The audio system 750 may generate one or more sound filters using one or more of the acoustic parameters received from the mapping server 725, and use the sound filters to provide audio content to the user.

The laser driver 770 drives one or more display elements in the display assembly 730. The laser driver 770 initially generates one or more first voltage pulse of a first duration. Using each first voltage pulse, the laser driver 770 generates a corresponding second voltage pulse of a second duration shorter than the first duration. The laser driver 770 then converts the second voltage pulse into a current pulse driving at least one display element in the display assembly 730 to initiate light emission in a spread spectrum thus mitigating the coherence artifacts in the emitted light. The laser driver may be an embodiment of the laser driver 200 in FIG. 2.

The I/O interface 710 is a device that allows a user to send action requests and receive responses from the console 715. An action request is a request to perform a particular action. For example, an action request may be an instruction to start or end capture of image or video data, or an instruction to perform a particular action within an application. The I/O interface 710 may include one or more input devices. Example input devices include: a keyboard, a mouse, a game controller, or any other suitable device for receiving action requests and communicating the action requests to the console 715. An action request received by the I/O interface 710 is communicated to the console 715, which performs an action corresponding to the action request. In some embodiments, the I/O interface 710 includes an IMU that captures calibration data indicating an estimated position of the I/O interface 710 relative to an initial position of the I/O interface 710. In some embodiments, the I/O interface 710 may provide haptic feedback to the user in accordance with instructions received from the console 715. For example, haptic feedback is provided when an action request is received, or the console 715 communicates instructions to the I/O interface 710 causing the I/O interface 710 to generate haptic feedback when the console 715 performs an action.

The console 715 provides content to the headset 705 for processing in accordance with information received from one or more of: the DCA 745, the headset 705, and the I/O interface 710. In the example shown in FIG. 7, the console 715 includes an application store 755, a tracking module 760, and an engine 765. Some embodiments of the console 715 have different modules or components than those described in conjunction with FIG. 7. Similarly, the functions further described below may be distributed among components of the console 715 in a different manner than described in conjunction with FIG. 7. In some embodiments, the functionality discussed herein with respect to the console 715 may be implemented in the headset 705, or a remote system.

The application store 755 stores one or more applications for execution by the console 715. An application is a group of instructions, that when executed by a processor, generates content for presentation to the user. Content generated by an application may be in response to inputs received from the user via movement of the headset 705 or the I/O interface 710. Examples of applications include: gaming applications, conferencing applications, video playback applications, or other suitable applications.

The tracking module 760 tracks movements of the headset 705 or of the I/O interface 710 using information from the DCA 745, the one or more position sensors 740, or some combination thereof. For example, the tracking module 760 determines a position of a reference point of the headset 705 in a mapping of a local area based on information from the headset 705. The tracking module 760 may also determine positions of an object or virtual object. Additionally, in some embodiments, the tracking module 760 may use portions of data indicating a position of the headset 705 from the position sensor 740 as well as representations of the local area from the DCA 745 to predict a future location of the headset 705. The tracking module 760 provides the estimated or predicted future position of the headset 705 or the I/O interface 710 to the engine 765.

The engine 765 executes applications and receives position information, acceleration information, velocity information, predicted future positions, or some combination thereof, of the headset 705 from the tracking module 760. Based on the received information, the engine 765 determines content to provide to the headset 705 for presentation to the user. For example, if the received information indicates that the user has looked to the left, the engine 765 generates content for the headset 705 that mirrors the user's movement in a virtual local area or in a local area augmenting the local area with additional content. Additionally, the engine 765 performs an action within an application executing on the console 715 in response to an action request received from the I/O interface 710 and provides feedback to the user that the action was performed. The provided feedback may be visual or audible feedback via the headset 705 or haptic feedback via the I/O interface 710.

The network 720 couples the headset 705 and/or the console 715 to the mapping server 725. The network 720 may include any combination of local area and/or wide area networks using both wireless and/or wired communication systems. For example, the network 720 may include the Internet, as well as mobile telephone networks. In one embodiment, the network 720 uses standard communications technologies and/or protocols. Hence, the network 720 may include links using technologies such as Ethernet, 802.11, worldwide interoperability for microwave access (WiMAX), 2G/3G/4G mobile communications protocols, digital subscriber line (DSL), asynchronous transfer mode (ATM), InfiniBand, PCI Express Advanced Switching, etc. Similarly, the networking protocols used on the network 720 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 720 can be represented using technologies and/or formats including image data in binary form (e.g. Portable Network Graphics (PNG)), hypertext markup language (HTML), extensible markup language (XML), etc. In addition, all or some of links can be encrypted using conventional encryption technologies such as secure sockets layer (SSL), transport layer security (TLS), virtual private networks (VPNs), Internet Protocol security (IPsec), etc.

The mapping server 725 may include a database that stores a virtual model describing a plurality of spaces, wherein one location in the virtual model corresponds to a current configuration of a local area of the headset 705. The mapping server 725 receives, from the headset 705 via the network 720, information describing at least a portion of the local area and/or location information for the local area. The user may adjust privacy settings to allow or prevent the headset 705 from transmitting information to the mapping server 725. The mapping server 725 determines, based on the received information and/or location information, a location in the virtual model that is associated with the local area of the headset 705. The mapping server 725 determines (e.g., retrieves) one or more acoustic parameters associated with the local area, based in part on the determined location in the virtual model and any acoustic parameters associated with the determined location. The mapping server 725 may transmit the location of the local area and any values of acoustic parameters associated with the local area to the headset 705.

One or more components of system 700 may contain a privacy module that stores one or more privacy settings for user data elements. The user data elements describe the user or the headset 705. For example, the user data elements may describe a physical characteristic of the user, an action performed by the user, a location of the user of the headset 705, a location of the headset 705, head-related transfer functions (HRTFs) for the user, etc. Privacy settings (or "access settings") for a user data element may be stored in any suitable manner, such as, for example, in association with the user data element, in an index on an authorization server, in another suitable manner, or any suitable combination thereof.

A privacy setting for a user data element specifies how the user data element (or particular information associated with the user data element) can be accessed, stored, or otherwise used (e.g., viewed, shared, modified, copied, executed, surfaced, or identified). In some embodiments, the privacy settings for a user data element may specify a "blocked list" of entities that may not access certain information associated with the user data element. The privacy settings associated with the user data element may specify any suitable granularity of permitted access or denial of access. For example, some entities may have permission to see that a specific user data element exists, some entities may have permission to view the content of the specific user data element, and some entities may have permission to modify the specific user data element. The privacy settings may allow the user to allow other entities to access or store user data elements for a finite period of time.

The privacy settings may allow a user to specify one or more geographic locations from which user data elements can be accessed. Access or denial of access to the user data elements may depend on the geographic location of an entity who is attempting to access the user data elements. For example, the user may allow access to a user data element and specify that the user data element is accessible to an entity only while the user is in a particular location. If the user leaves the particular location, the user data element may no longer be accessible to the entity. As another example, the user may specify that a user data element is accessible only to entities within a threshold distance from the user, such as another user of a headset within the same local area as the user. If the user subsequently changes location, the entity with access to the user data element may lose access, while a new group of entities may gain access as they come within the threshold distance of the user.

The system 700 may include one or more authorization/privacy servers for enforcing privacy settings. A request from an entity for a particular user data element may identify the entity associated with the request and the user data element may be sent only to the entity if the authorization server determines that the entity is authorized to access the user data element based on the privacy settings associated with the user data element. If the requesting entity is not authorized to access the user data element, the authorization server may prevent the requested user data element from being retrieved or may prevent the requested user data element from being sent to the entity. Although this disclosure describes enforcing privacy settings in a particular manner, this disclosure contemplates enforcing privacy settings in any suitable manner.

Additional Configuration Information

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A pulse scaling circuit comprising:
a first transistor with a first gate electrode receiving an input pulse of a first duration;
a capacitor having an electrode connected to a common terminal of a pair of resistors connected in series with the first transistor; and
a second transistor with a second gate electrode connected to the first gate electrode and a second drain electrode coupled to a supply voltage via a resistor, wherein,
responsive to the reception of the input pulse, an output pulse of a second duration shorter than the first duration is generated at the second drain electrode.

2. The pulse scaling circuit of claim 1, further comprising a third transistor connected in series with the second transistor, a third gate electrode of the third transistor connected to the electrode of the capacitor.

3. The pulse scaling circuit of claim 2, wherein a ratio between a first resistance of a first resistor in the pair and a second resistance of a second resistor in the pair is such that a voltage at the electrode of the capacitor at an end of a discharge cycle of the capacitor is below a threshold voltage of the third gate electrode.

4. The pulse scaling circuit of claim 2, wherein the second and third transistors are turned on at an end of the input pulse.

5. The pulse scaling circuit of claim 2, wherein the output pulse lasts until a voltage at the electrode of the capacitor becomes lower than a threshold voltage of the third gate electrode.

6. The pulse scaling circuit of claim 1, wherein the input pulse coincides with a charge cycle of the capacitor, and the output pulse coincides with a discharge cycle of the capacitor following the charge cycle.

7. The pulse scaling circuit of claim 1, wherein:
the capacitor is charged during a charge cycle with a charge current flowing through a first resistor in the pair, the input pulse causing the first transistor and the second transistor to be turned off during the charge cycle; and
the capacitor is discharged during a discharge cycle following the charge cycle with a discharge current flowing through a second resistor in the pair and the first transistor.

8. The pulse scaling circuit of claim 7, wherein a ratio between a first resistance of the first resistor and a second resistance of the second resistor causes that a ratio between an average value of the charge current and an average value of the discharge current corresponds to a ratio between the first duration and the second duration.

9. The pulse scaling circuit of claim 1, wherein the first duration and the second duration are in the order of nanoseconds or below 1 nanosecond.

10. The pulse scaling circuit of claim 1, wherein each of the first transistor and the second transistor is a Gallium Nitride field-effect transistor (GaN FET).

11. A laser driver comprising:
a pulse generator circuit configured to generate a first voltage pulse of a first duration;
a pulse scaling circuit coupled to the pulse generator circuit, the pulse scaling circuit comprising:
a first transistor with a first gate electrode receiving the first voltage pulse,
a capacitor having an electrode connected to a common terminal of a pair of resistors connected in series with the first transistor, and
a second transistor with a second gate electrode connected to the first gate electrode and a second drain electrode coupled to a supply voltage via a resistor, wherein,
responsive to the reception of the first voltage pulse, a second voltage pulse of a second duration shorter than the first duration is generated at the second drain electrode; and
a power stage circuit coupled to the pulse scaling circuit, the power stage circuit configured to convert the second voltage pulse into a current pulse driving at least one emission element of a laser display.

12. The laser driver of claim 11, wherein the at least one emission element driven by the current pulse emits one or more light beams in a spread spectrum mitigating a level of coherence artifacts of light emitted from the laser display.

13. The laser driver of claim 11, wherein the at least one emission element comprises at least one laser diode.

14. The laser driver of claim 11, wherein the laser driver is integrated into a headset, and the laser driver initiates emission of image light from the laser display integrated into the headset.

15. The laser driver of claim 11, wherein the power stage circuit comprises a current source based on a pulse-width modulation (PWM) controller with a voltage feedback loop and a current feedback loop.

16. The laser driver of claim 11, wherein the pulse scaling circuit further comprising a third transistor connected in series with the second transistor, a third gate electrode of the third transistor connected to the electrode of the capacitor.

17. The laser driver of claim 16, wherein:
the second and third transistors are turned on at an end of the first voltage pulse; and
the second voltage pulse lasts until a voltage at the electrode of the capacitor becomes lower than a threshold voltage of the third gate electrode.

18. The laser driver of claim 11, wherein:
the capacitor is charged during a charge cycle with a charge current flowing through a first resistor in the pair, the first voltage pulse causing the first transistor and the second transistor to be turned off during the charge cycle;
the capacitor is discharged during a discharge cycle following the charge cycle with a discharge current flowing through a second resistor in the pair and the first transistor; and
a ratio between a first resistance of the first resistor and a second resistance of the second resistor causes that a ratio between an average value of the charge current and an average value of the discharge current corresponds to a ratio between the first duration and the second duration.

19. A method comprising:

receiving an input pulse of a first duration at a first gate electrode of a first transistor;

charging a capacitor during the first duration, the capacitor having an electrode connected to a common terminal of a pair of resistors connected in series with the first transistor; and discharging the capacitor to generate an output pulse of a second duration shorter than the first duration at a second drain electrode of a second transistor, a second gate electrode of the second transistor connected to the first gate electrode and the second drain electrode coupled to a supply voltage via a resistor.

20. The method of claim 19, further comprising:

charging the capacitor during a charge cycle with a charge current flowing through a first resistor in the pair, the input pulse causing the first transistor and the second transistor to be turned off during the charge cycle; and discharging the capacitor during a discharge cycle following the charge cycle with a discharge current flowing through a second resistor in the pair and the first transistor, wherein a ratio between a first resistance of the first resistor and a second resistance of the second resistor causes that a ratio between an average value of the charge current and an average value of the discharge current corresponds to a ratio between the first duration and the second duration.

\* \* \* \* \*